(12) United States Patent
Vijayaraghavan et al.

(10) Patent No.: US 10,947,107 B2
(45) Date of Patent: Mar. 16, 2021

(54) DEVICE AND METHOD OF FABRICATING SUCH A DEVICE

(71) Applicant: The University of Manchester, Manchester (GB)

(72) Inventors: Aravind Vijayaraghavan, Manchester (GB); Christian Berger, Manchester (GB)

(73) Assignee: The University of Manchester, Manchester (GB)

( * ) Notice: Subject to any disclaimer, the term of this patent is extended or adjusted under 35 U.S.C. 154(b) by 296 days.

(21) Appl. No.: 15/772,983

(22) PCT Filed: Nov. 4, 2016

(86) PCT No.: PCT/GB2016/053457
§ 371 (c)(1),
(2) Date: May 2, 2018

(87) PCT Pub. No.: WO2017/077331
PCT Pub. Date: May 11, 2017

(65) Prior Publication Data
US 2018/0327252 A1    Nov. 15, 2018

(30) Foreign Application Priority Data

Nov. 6, 2015 (GB) ...................... 1519620

(51) Int. Cl.
*B81B 3/00* (2006.01)
*B81C 1/00* (2006.01)
(Continued)

(52) U.S. Cl.
CPC ............ *B81B 3/007* (2013.01); *B81B 3/0097* (2013.01); *B81C 1/00158* (2013.01);
(Continued)

(58) Field of Classification Search
None
See application file for complete search history.

(56) References Cited

U.S. PATENT DOCUMENTS

| 5,650,597 A | 7/1997 | Redmayne |
| 7,995,777 B2 * | 8/2011 | Yu ........................ H04R 17/005 381/191 |

(Continued)

FOREIGN PATENT DOCUMENTS

| CN | 102564657 A | 7/2012 |
| CN | 203629725 U | 6/2014 |

(Continued)

OTHER PUBLICATIONS

International Search Report and Written Opinion of PTC/GB2016/053457, dated Dec. 20, 2016, 8 Pages.

(Continued)

*Primary Examiner* — J.E. Schoenholtz
(74) *Attorney, Agent, or Firm* — Nixon Peabody LLP; Linda B. Huber

(57) ABSTRACT

There is disclosed a device and method for fabricating such a device. The device includes cavities formed in a substrate. A laminated membrane is mounted to the substrate and spans the cavities. The laminated membrane includes a layer of a flexible material, typically a polymer, and a layer of a two-dimensional material that is typically graphene.

28 Claims, 14 Drawing Sheets

(51) Int. Cl.
*H01H 1/00* (2006.01)
*H01L 29/16* (2006.01)
(52) U.S. Cl.
CPC ....... *H01H 1/0094* (2013.01); *H01L 29/1606* (2013.01); *B81B 2201/02* (2013.01); *B81B 2203/04* (2013.01); *H04R 2307/023* (2013.01)

(56) References Cited

U.S. PATENT DOCUMENTS

| | | | |
|---|---|---|---|
| 8,182,917 | B2 | 5/2012 | Robinson et al. |
| 8,607,651 | B2 | 12/2013 | Eventoff |
| 8,664,642 | B1* | 3/2014 | Davis ................ H01L 31/028 257/29 |
| 8,873,776 | B2* | 10/2014 | Kim ................ H04R 17/005 381/173 |
| 8,901,680 | B2 | 12/2014 | Cai et al. |
| 2007/0019280 | A1 | 1/2007 | Sasagawa et al. |
| 2008/0225370 | A1 | 9/2008 | Mansell |
| 2010/0006840 | A1 | 1/2010 | Robert |
| 2010/0140723 | A1 | 6/2010 | Kurtz et al. |
| 2011/0200787 | A1 | 8/2011 | Regan et al. |
| 2011/0242932 | A1 | 10/2011 | Lebental et al. |
| 2013/0126325 | A1* | 5/2013 | Curtis ................ H03K 17/9622 200/5 A |
| 2013/0257787 | A1 | 10/2013 | White et al. |
| 2013/0270511 | A1 | 10/2013 | Cai et al. |
| 2013/0273682 | A1 | 10/2013 | Cai et al. |
| 2013/0285970 | A1 | 10/2013 | Ahn et al. |
| 2014/0037126 | A1* | 2/2014 | Pinkerton ............. H04R 19/02 381/396 |
| 2014/0053651 | A1 | 2/2014 | Besling et al. |
| 2014/0151786 | A1 | 6/2014 | Guo et al. |
| 2014/0154851 | A1 | 6/2014 | Guo et al. |
| 2014/0270271 | A1 | 9/2014 | Dehe et al. |
| 2015/0020610 | A1 | 1/2015 | Hurst et al. |
| 2015/0098595 | A1 | 4/2015 | Pinkerton et al. |
| 2015/0208174 | A1 | 7/2015 | Pinkerton et al. |
| 2015/0377663 | A1 | 12/2015 | Kulkarni |

FOREIGN PATENT DOCUMENTS

| | | |
|---|---|---|
| CN | 104155051 A | 11/2014 |
| CN | 105136351 A | 12/2015 |
| CN | 105241571 A | 1/2016 |
| DE | 102013114615 A1 | 6/2015 |
| EP | 2698616 A2 | 2/2014 |
| EP | 2748695 A1 | 7/2014 |
| JP | 2001272294 A | 10/2001 |
| JP | 2008020243 A | 1/2008 |
| JP | 2012249274 A | 12/2012 |
| JP | 2015522851 A | 8/2015 |
| WO | 02/22492 A2 | 3/2002 |
| WO | 2007147643 A2 | 12/2007 |
| WO | 2011142637 A2 | 11/2011 |
| WO | 2013049816 A2 | 4/2013 |
| WO | 2013192335 A1 | 12/2013 |
| WO | 2014100012 A1 | 6/2014 |
| WO | 2014160178 A1 | 10/2014 |
| WO | 2015083073 A1 | 6/2015 |
| WO | 2017077331 A1 | 5/2017 |

OTHER PUBLICATIONS

Search Report of GB 1519620.7, dated Apr. 19, 2016, 3 Pages.
Aguilera-Servin et al., Nanoscale Pressure Sensors Realized from Suspended Graphene Membrane Devices, 2015, Applied Physics Letters, vol. 106, 083103, 5 Pages.
Bunch et al., Electromechanical Resonators from Graphene Sheets, 2007, Science, vol. 315, 490, 5 Pages.
Cao et al., A Blister Test for the Interfacial Adhesion of Large-Scale Transferred Graphene, 2014, Carbon, vol. 69, pp. 390-400.
Chen et al., Graphene Mechanical Oscillators with Tunable Frequency, 2013, Nature Nanotechnology, vol. 8, pp. 923-927.
Chen et al., Graphene Nanoelectromechanical Systems, 2013, Proceedings of the IEEE, vol. 101(7), p. 1766-1779.
Chen et al., Performance of Monolayer Graphene Nanomechanical Resonators with Electrical Readout., 2009, Nature Nanotechnology, vol. 4, pp. 861-867.
Chong et al., Capacitive Micromachined Ultrasonic Transducer (CMUT) Array with Single-Layer Graphene Membrane, 2014, Micro & Nano Letters, vol. 9(12), pp. 884-886.
Chun et al., A Graphene Force Sensor with Pressure-Amplifying Structure, 2014, Carbon, vol. 78, pp. 601-608.
Chun et al., A Highly Sensitive Pressure Sensor using a Double-Layer Graphene Structure for Tactile Sensing, 2015, Nanoscale, DOI: 10.1039/c5nr00076a, 8 Pages.
Gong et al., Interfacial Stress Transfer in a Graphene Monolayer Nanocomposite, 2010, Advanced Materials, vol. 22, pp. 2694-2697.
Hurst et al., A Transconductive Graphene Pressure Sensor, 2013, Transducers, pp. 586-589.
Jiang et al., Interfacial Sliding and Buckling of Monolayer Graphene on a Stretchable Substrate, 2014, Advanced Functional Materials, pp. 396-402.
Lee et al., Electrically Integrated SU-8 Clamped Graphene Drum Resonators for Strain Engineering, 2013, Applied Physics Letters, vol. 102, 153101, 5 Pages.
Lee et al., Mass Detection using a Graphene-Based Nanomechanical Resonator, 2013, Japanese Journal of Applied Physics, vol. 52, 025101, 5 Pages.
Liu et al., Large Arrays and Properties of 3-Terminal Graphene Nanoelectromechanical Switches, 2014, Advanced Materials, vol. 26, pp. 1571-1576.
Mirnezhad et al., Graphene-Based Sensors for Monitoring Strain: A First-Principles Density Functional Theory Analysis, 2013, Int'l Journal of Chemoinformatics and Chem. Eng., vol. 3(1), pp. 74-83.
Moldovan et al., Fabrication Process and Characterization of Suspended Graphene Membranes for RF NEMS Capacitive Switches, 2015, Microelectronic Engineering, vol. 145, pp. 5-8.
Robinson et al., Wafer-Scale Reduced Graphene Oxide Films for Nanomechanical Devices, 2008, Nano Letters, vol. 8(10), pp. 3441-3445.
Sangermano et al., Graphene-Epoxy Flexible Transparent Capacitor Obtainined by Graphene-Polymer Transfer and UV-Induced Bonding., 2014, Macromol. Rapid Commu., vol. 35, pp. 355-359.
Smith et al., Biaxial Strain in Suspended Graphene Membranes for Piezoresistive Sensing, 2014, MEMS, pp. 1055-1058.
Smith et al., Electromechanical Piezoresistive Sensing in Suspended Graphene Membranes, 2013, Nano Letter, vol. 13, pp. 3237-3242.
Smith et al., Strain Engineering in Suspended Graphene Devices for Pressure Sensor Applications, 2012, IEEE, DOI:10.1109/ULIS.2012. 6193347, 4 Pages.
Todorovic et al, Multilayer Graphene Condenser Microphone, 2015, IOPScience, 14 Pages.
Van Der Zande et al., Large-Scale Arrays of Single Layer Graphene Resonators, 2010, Nano Letters, vol. 10, pp. 4869-4873.
Wang et al., Observation of a Giant Two-Dimensional Band-Piezoelectric Effect on Biaxial-Strained Graphene, 2015, NPG Asia Materials, vol. 7, e154, 7 Pages.
Xu et al., Radio Frequency Electrical Transduction of Graphene Mechanical Resonators., 2010, Applied Physics Letters, vol. 97, 243111, 3 Pages.
Young et al., Strain Mapping in a Graphene Monolayer Nanocomposite, 2011, ACS Nano, vol. 5(4), pp. 3079-3084.
Zhang et al., Continuous Graphene and Carbon Nanotube Based High Flexible and Transparent Pressure Sensor Arrays, 2015, Nanotechnology, vol. 26, 115501, 11 Pages.
Zhou et al., Graphene Electrostatic Microphone and Ultrasonic Radio, 2015, PNAS Early Edition, 5 Pages.
International Preliminary Report on Patentability of PCT/GB2016/053457, dated May 17, 2018, 7 Pages.

* cited by examiner

«DEVICE AND METHOD OF FABRICATING SUCH A DEVICE»

CROSS-REFERENCE TO RELATED APPLICATIONS

This application is a National Phase of International Application No. PCT/GB2016/053457 filed Nov. 4, 2016, currently pending, which designated the U.S. and that International Application was published under PCT Article 21(2) in English. This application also includes a claim of priority under 35 U.S.C. § 119(a) and § 365(b) to British patent application No. GB 1519620.7 filed Nov. 6, 2015, the entirety of which is hereby incorporated by reference.

FIELD OF THE INVENTION

The present invention relates to a device and method of fabricating such a device. More particularly, the invention relates to a device with a laminated membrane that spans at least part of a cavity in a substrate, and a method of fabricating a device with a laminated membrane that spans at least part of a cavity in a substrate.

BACKGROUND OF THE INVENTION

Devices such as nano-electromechanical systems devices (NEMS) may have a membrane suspended over a cavity. The membrane may be formed from a two-dimensional material such as graphene and such NEMS devices have a low yield mainly due to large surface tensions acting on the suspended two-dimensional material typically during a drying process during fabrication of the device. Furthermore, due to the dimensions of the membrane, especially its nanometre sized thickness, calibration and achieving a desired tension of the membrane can be difficult to consistently achieve.

In addition to the above, the accuracy and reliability of NEMS devices that have a membrane suspended over a cavity may be affected by variations in ambient conditions.

It is an aim of embodiments of the invention to overcome or at least alleviate one or more problems of the prior art.

SUMMARY OF THE INVENTION

According to a first aspect of the invention there is provided a device comprising: a substrate with at least one cavity therein; a laminated membrane mounted to the substrate, wherein the laminated membrane spans at least part of the cavity, and wherein the laminated membrane includes at least one layer of a flexible material and at least one layer of a two-dimensional material; and a functional component, wherein the laminated membrane is arranged to deform with respect to a position of the functional component.

According to a second aspect of the invention there is provided a method of fabricating a device, the method comprising: forming a substrate with at least one cavity therein; mounting a laminated membrane to the substrate so that the laminated membrane spans at least part of the cavity, and wherein the laminated membrane includes at least one layer of a flexible material and at least one layer of a two-dimensional material; and mounting a functional component to the substrate, wherein the laminated membrane is arranged to deform with respect to a position of the functional component.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which.

DETAILED DESCRIPTION OF THE EMBODIMENTS

Figure 1:
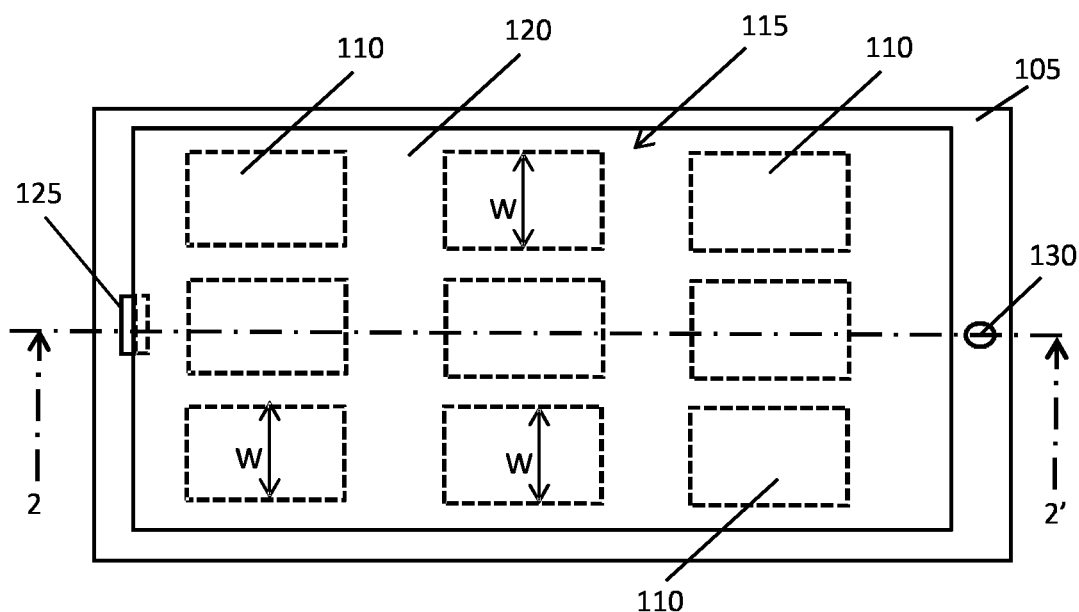
FIG. 1 is a plan view of a device according to a first embodiment of the present invention.

The detailed description set forth below in connection with the appended drawings is intended as a description of embodiments of the invention, and is not intended to represent the only forms in which the present invention may be practised. It is to be understood that the same or equivalent functions may be accomplished by different embodiments that are intended to be encompassed within the scope of the invention. In the drawings, like numerals are used to indicate like elements throughout. Furthermore, the terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

Throughout this specification the phrase "two-dimensional material" has the meaning of a material selected from the group of materials including: one or more single layers of homo-atoms or hetero-atoms arranged in layers with strong bonds within a layer and weaker bonds in between layers of the material; or a single layer of homo-atoms or hetero-atoms that is either free-standing or supported on another material wherein the atoms are arranged in a planar structure which has one dimension significantly smaller than its other two dimensions; or a crystalline material wherein unit cells are repeated in two spatial dimensions but not in the third dimension; or a material having a thickness of less than five nanometres. Also, throughout the specification some embodiments, by way of example, as are described to include a two-dimensional material, which includes chemical modifications of materials selected from a group comprising: graphene, hexagonal boron nitride, phosphorene, transition metal dichalcogenides, transition metal oxides, layered clay materials, graphene oxide, fluorographene, germanene, graphane, graphyne, borophene, silicene, and stanene.

Figure 2:
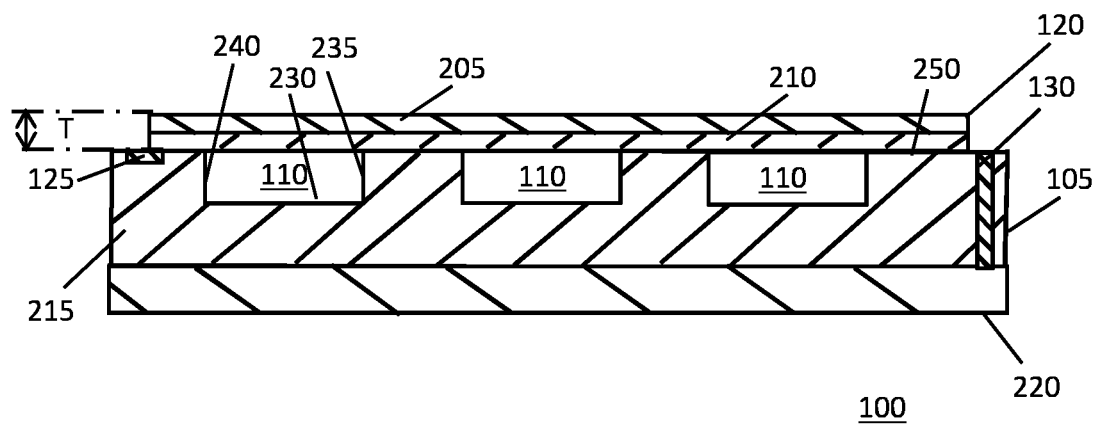
FIG. 2 is a cross sectional side view through 2-2' of the device of FIG. 1 according to the first embodiment of the present invention.

Referring now to FIG. 1 and FIG. 2 there is illustrated a device 100 according to a first embodiment of the present invention. The device 100 includes a substrate 105 with at least one open topped cavity 110 formed in the substrate 105. In this particular embodiment, as illustrated, there is a plurality of cavities 110 formed in an array 115, and each of the cavities 110 has a greatest width (w) between opposite internal surfaces which in this embodiment is a constant width throughout the depth of each cavity 110.

The device 100 also includes a laminated membrane 120 mounted to the substrate 105. In this embodiment the laminated membrane 120 spans each cavity 110 and completely covers each cavity 110. Typically the laminated membrane 120 forms an air tight seal for each cavity 110. In some embodiments a ratio of a surface area of the laminated membrane 120 spanning each cavity 110 is between 0.5 to twenty times that of a surface area of the laminated membrane 120 abutting or contacting the substrate 105. In other embodiments the ratio of a surface area of the laminated membrane 120 spanning each cavity 110 is between five to ten times that of a surface area of the laminated membrane 120 abutting or contacting the substrate 105. In this embodiment the device 100 includes a first electrode formed by the laminated membrane 120, providing a first electrode region, which is electrically attached to a metallic pad 125 on the substrate 105. The metallic pad 125, typically gold, in some embodiments may include associated runners extending around or between each cavity 110 to provide a low resistance conduction path associated with each cavity. This may be important for high frequency applications because a single layer of the two-dimensional material has a relatively high sheet resistance. The device 100 may also comprise a functional component, wherein in operation the laminated membrane 120 is arranged to deform with respect to a position of the functional component. In some embodiments, the functional component may be a secondary device, a circuit, or means for outputting a signal in response to the deformation of the laminated membrane 120. In this embodiment, the functional component comprises a second electrode formed from a conductive via 130 formed in the substrate 105 and electrically attached to a second electrode region 220 of the substrate 105. The metallic pad 125 and the conductive via 130 provide surfaces for attachment of wire bonds as will be apparent to a person skilled in the art.

As illustrated, the laminated membrane 120 includes layers of material which are at least one layer of a flexible material 205 and at least one layer of a two-dimensional material 210. In one embodiment the laminated membrane 120 may comprise a single layer of two-dimensional material 210. The laminated membrane 120 may also comprise a single layer of flexible material 205.

In one embodiment the flexible material 205 is a dielectric material typically comprising a polymer or a ceramic substance. A portion of the flexible material 205 may abut the substrate 105 and thus be sandwiched between the substrate 105 and two-dimensional material 210. However, in some embodiments the two-dimensional material 210 may abut the substrate 105 and thus be sandwiched between the substrate 105 and flexible material 205.

The layer of the two-dimensional material 210 may be a continuous layer or may comprise discontinuous sections or discontinuous sections of different two-dimensional materials. In some embodiments the thickness (T) of the laminated membrane 120 is less than the greatest width (w) of each cavity 110 and may be at least 100 times less than a greatest width (w) of each cavity 110. In other embodiments the thickness (T) of the laminated membrane 120 is greater than or equal to a greatest width (w) of each cavity 110.

Embodiments of the laminated membrane 120 may comprise: at least two layers of the two-dimensional material 210 sandwiching at least one layer of the flexible material 205; or at least two layers of the flexible material 205 sandwiching at least one layer of the two-dimensional material 210; or one layer of the two-dimensional material 210 deposited directly on top of one layer of the two-dimensional material 210.

As shown the substrate 105 comprises a first region 215 within which the cavities 110 and the second electrode region 220 are disposed. The first region 215 of the substrate 105 comprises a dielectric material selected from a group comprising: silicon oxide, silicon, silicon nitride, an epoxy based photoresist, an electron-beam resist, quartz, sapphire, glass, plastic, fibre-glass, hafnium oxide, aluminium oxide, boron nitride and doped silicon.

In this embodiment the laminated membrane 120 and the second electrode region 220 are arranged to form capacitive plates separated by at least part of each cavity 110. Typically, the second electrode region 220 comprises silicon or metal and there may also be an additional dielectric layer between the electrodes (capacitive plates). The additional dielectric layer may, be for example, deposited on a floor of each cavity 110 or on an underside of the laminated membrane 120. If required, each cavity 110 may be filled with a gas or a compressible foam or gel. In this embodiment, the laminated membrane 120 may be arranged to deform with respect to the second electrode region 220.

Each cavity 110 can be of many shapes and, as shown, each cavity 110 in this embodiment is rectangular in shape and comprises a floor 230 and at least two opposing parallel surfaces 235, 240 normal to the floor 230. Also, the substrate 105 comprises a planar mounting surface 250 parallel to and supporting the laminated membrane 120, wherein the floor 230 is parallel to the planar mounting surface 250.

Figure 3:
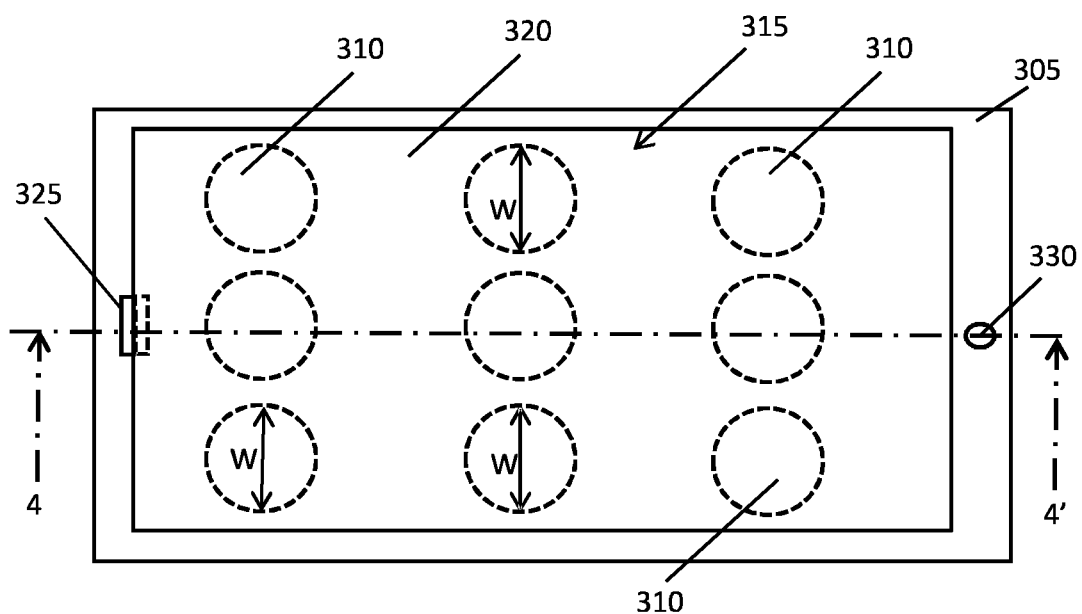
FIG. 3 is a plan view of a device according to a second embodiment of the present invention.
Figure 4:
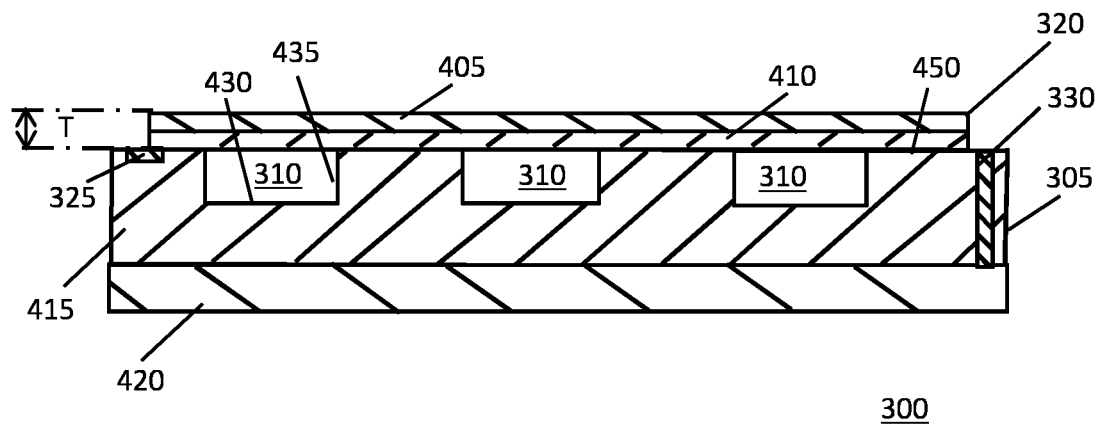
FIG. 4 is a cross sectional side view through 4-4' of the device of FIG. 3 according to the second embodiment of the present invention.

Referring now to FIG. 3 and FIG. 4 there is illustrated a device 300 according to a second embodiment of the present invention. The device 300 includes a substrate 305 with at least one open topped cavity 310 formed in the substrate 305. In this particular embodiment, as illustrated, there is a plurality of cavities 310 formed in an array 315, and each of the cavities 310 has a greatest width (w) between opposite internal surfaces which in this embodiment is a constant width throughout the depth of each cavity 310.

The device 300 also includes a laminated membrane 320 mounted to the substrate 305. In this embodiment the laminated membrane 320 spans each cavity 310 and completely covers each cavity 310. Typically the laminated membrane 320 forms an air tight seal for each cavity 310. In some embodiments a ratio of a surface area of the laminated membrane 320 spanning each cavity 310 is between 0.5 to twenty times that of a surface area of the laminated membrane 320 abutting the substrate 305. In other embodiments the ratio of a surface area of the laminated membrane 320 spanning each cavity 310 is between five to ten times that of a surface area of the laminated membrane 320 abutting the substrate 305. In this embodiment the device 300 includes a first electrode formed by the laminated membrane 320, providing a first electrode region, which is electrically attached to a metallic pad 325 on the substrate 305. The metallic pad 325, typically gold, in some embodiments may include associated runners extending around or between each cavity 310 to provide a low resistance conduction path associated with each cavity. The device 300 may also comprise a functional component, wherein in operation the laminated membrane 320 is arranged to deform with respect to the position of the functional component. In this embodiment, the functional component comprises a second electrode formed from a conductive via 330 formed in the substrate 305 and electrically attached to a second electrode region 420 of the substrate 305. The metallic pad 325 and the conductive via 330 provide surfaces for attachment of wire bonds as will be apparent to a person skilled in the art.

As illustrated, the laminated membrane 320 includes layers of material which are at least one layer of a flexible material 405 and at least one layer of a two-dimensional material 410. In one embodiment the laminated membrane 320 may comprise a single layer of two dimensional material 410. The laminated membrane 320 may also comprise a single layer of flexible material 405.

In one embodiment the flexible material 405 is a dielectric material typically comprising a polymer or a ceramic substance. A portion of the flexible material 405 may abut the substrate 305 and thus be sandwiched between the substrate 305 and two-dimensional material 410. However, in some embodiments the two-dimensional material 410 may abut the substrate 305 and thus be sandwiched between the substrate 305 and flexible material 405.

The layer of the two-dimensional material 410 may be a continuous layer or may comprise discontinuous sections or discontinuous sections of different two-dimensional materials. In some embodiments the thickness (T) of the laminated membrane 320 is less than the greatest width (w) of each cavity 310 (e.g. the diameter of each cavity 310) and may be at least 100 times less than a greatest width (w) of each cavity 310. In other embodiments the thickness (T) of the laminated membrane 320 is greater than or equal to a greatest width (w) of each cavity 310.

Embodiments of the laminated membrane 320 may comprise: at least two layers of the two-dimensional material 410 sandwiching at least one layer of the flexible material 405; at least two layers of the flexible material 405 sandwiching at least one layer of the two-dimensional material 410; or one layer of the two-dimensional material 410 deposited directly on top of one layer of the two-dimensional material 410.

As shown the substrate 305 comprises a first region 415 within which the cavities 310 and the second electrode region 420 are disposed. The first region 415 of the substrate 305 comprises a dielectric material selected from a group comprising: silicon oxide, silicon, silicon nitride, an epoxy based photoresist, an electron-beam resist, quartz, sapphire, glass, plastic, fibre-glass, hafnium oxide, aluminium oxide, boron nitride and doped silicon.

In this embodiment the laminated membrane 320 and the second electrode region 420 are arranged to form capacitive plates separated by at least part of each cavity 310. Typically, the second electrode region 420 comprises silicon or metal and there may also be an additional dielectric layer disposed between the electrodes (capacitive plates). The additional dielectric layer may be, for example, deposited on a floor of each cavity 310 or on an underside of the laminated membrane 320. If required, each cavity 310 may be filled with a gas or a compressible foam or gel. In this embodiment, the laminated membrane 320 may be arranged to deform with respect to the second electrode region 420.

Each cavity 310 can be of many shapes and, as shown, each cavity 310 in this embodiment is cylindrical in shape and comprises a floor 430 and a continuous surface 435 normal to the floor 430. Also, the substrate 305 comprises a planar mounting surface 450 parallel to and supporting the laminated membrane 320, wherein the floor 430 is parallel to the planar mounting surface 450.

Figure 5:
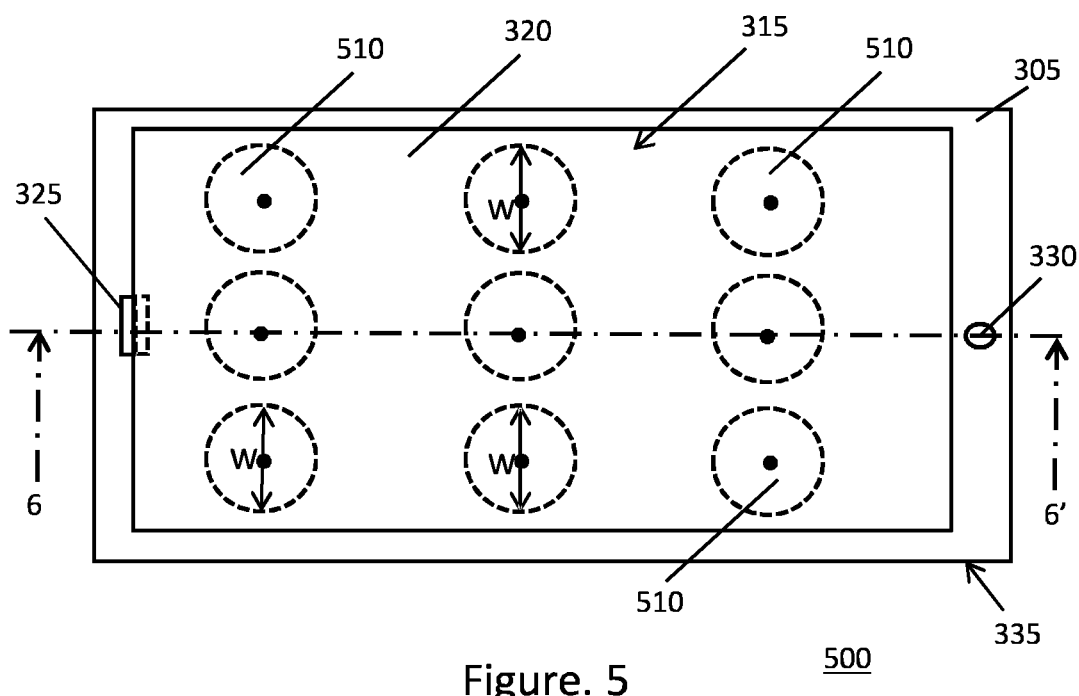
FIG. 5 is a plan view of a device according to a third embodiment of the present invention.
Figure 6:
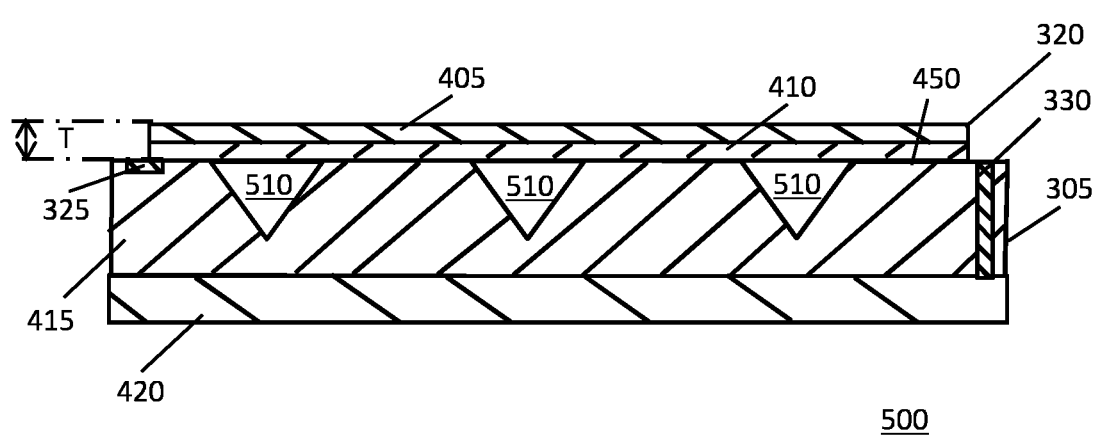
FIG. 6 is a cross sectional side view through 6-6' of the device of FIG. 5 according to the third embodiment of the present invention.

Referring now to FIG. 5 and FIG. 6 there is illustrated a device 500 according to a third embodiment of the present invention. The device 500 is similar to the device 300 and therefore to avoid repetition only the differences will be described. Furthermore identical numerals in the figures indicate identical elements and therefore as shown the only difference between devices 500 and 300 is the shape of the cavities 510. More specifically each of the cavities 510 are conical or frusto-conical in shape and include an inwardly tapered surface. In this particular embodiment, as illustrated, each of the cavities 510 has a greatest width (w) between diametrically opposite internal surfaces which in this embodiment is greatest at the region proximal to the laminated membrane 320.

Figure 7:
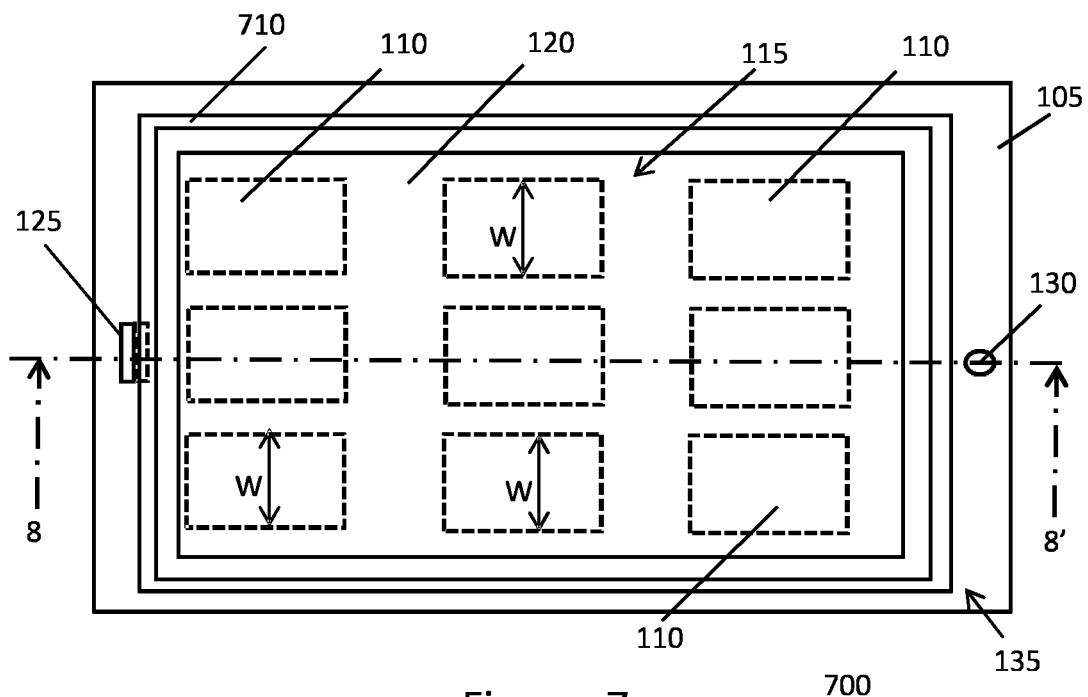
FIG. 7 is a plan view of a device according to a fourth embodiment of the present invention.
Figure 8:
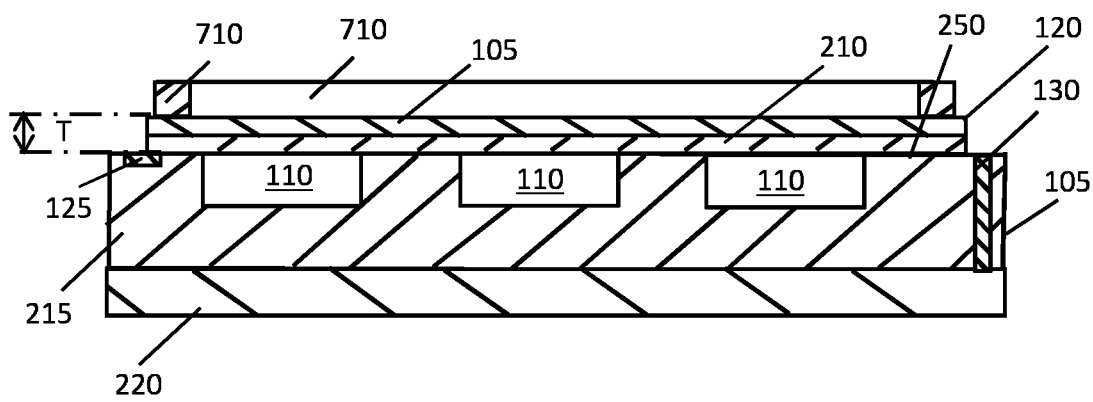
FIG. 8 is a cross sectional side view through 8-8' of the device of FIG. 7 according to the fourth embodiment of the present invention.

Referring now to FIG. 7 and FIG. 8 there is illustrated a device 700 according to a fourth embodiment of the present invention. The device 700 is similar to the device 100 and therefore to avoid repetition only the differences will be described. Furthermore identical numerals in the figures indicate identical elements and therefore as shown the only difference between devices 700 and 100 is the addition of a frame 710 on the laminated membrane 120. The frame 710 as shown surrounds an opening of each cavity 110 and in some embodiments may individually surround an opening of each cavity 110. The frame 710 acts as a clamp to stretch the laminated membrane 120 and is typically formed of a polymer or ceramic material. Also, each cavity 110 may be of any suitable shape such as cylindrical, conical or frusto-conical.

Figure 9:
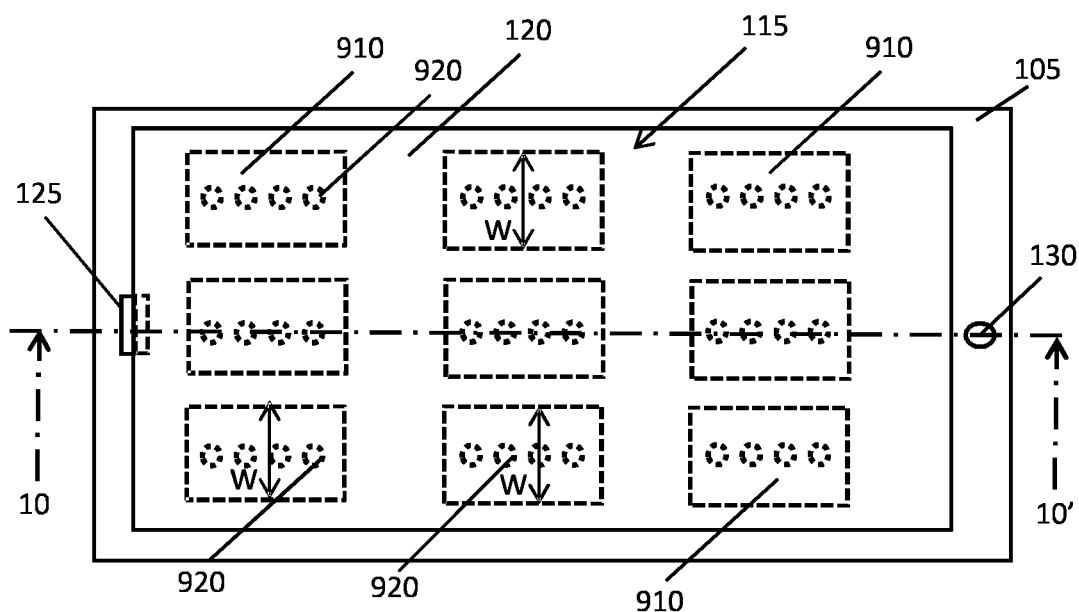
FIG. 9 is a plan view of a device according to a fifth embodiment of the present invention.
Figure 10:
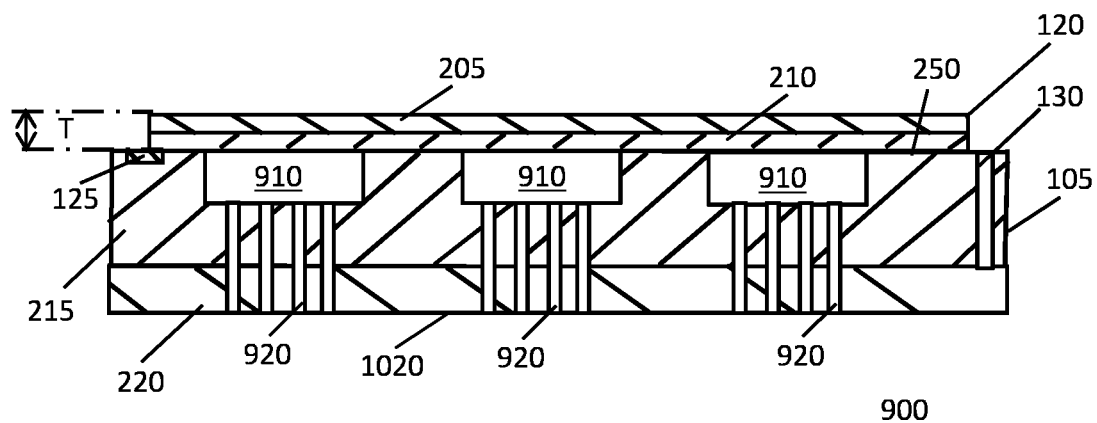
FIG. 10 is a cross sectional side view through 10-10' of the device of FIG. 9 according to the fifth embodiment of the present invention.

Referring now to FIG. 9 and FIG. 10 there is illustrated a device 900 according to a fifth embodiment of the present invention. The device 900 is similar to the device 100 and therefore to avoid repetition only the differences will be described. Furthermore identical numerals in the figures indicate identical elements and as illustrated there are passages 920 in the substrate 105 for providing fluid communication from each cavity 910 to an external surface 1020 of the substrate 105. As above, each cavity 910 can be any suitable shape such as cylindrical, conical or frusto-conical.

Figure 11:
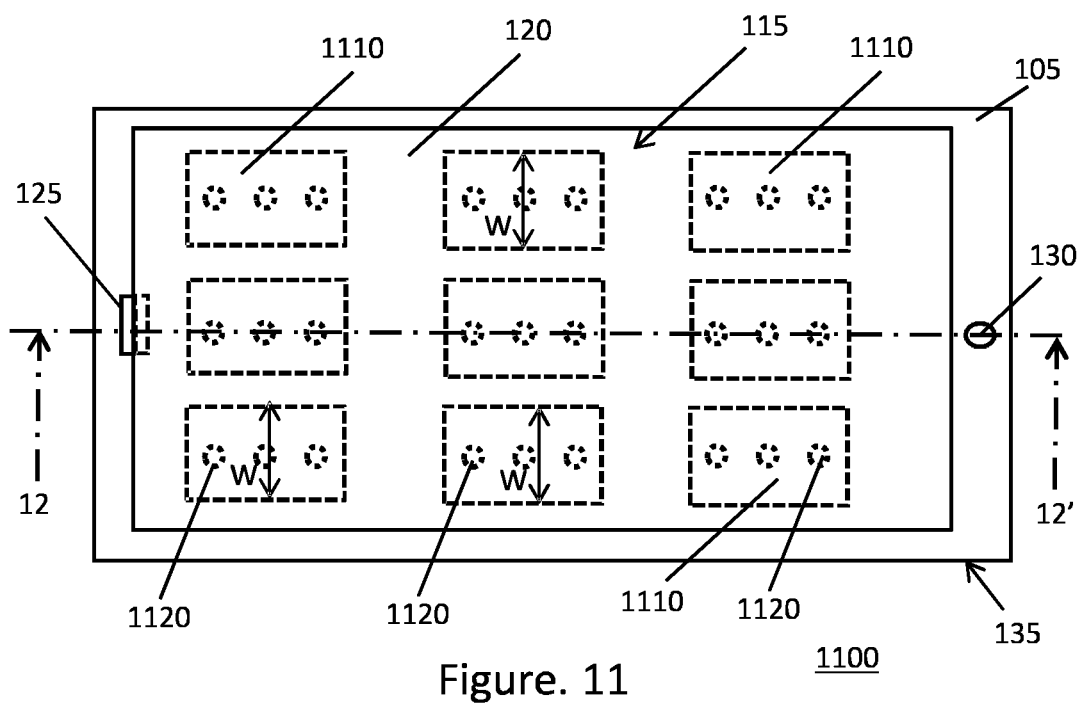
FIG. 11 is a plan view of a device according to a sixth embodiment of the present invention.
Figure 12:
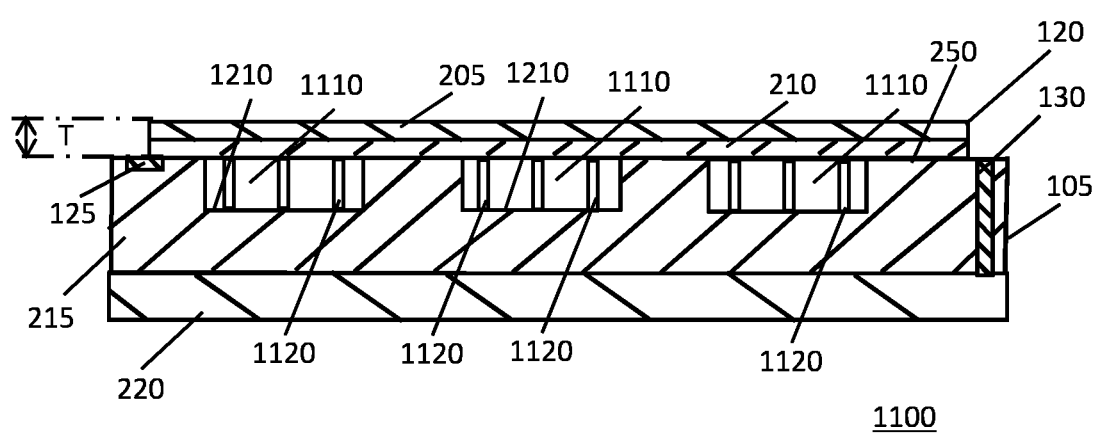
FIG. 12 is a cross sectional side view through 12-12' of the device of FIG. 11 according to the sixth embodiment of the present invention.

Referring now to FIG. 11 and FIG. 12 there is illustrated a device 1100 according to a sixth embodiment of the present invention. The device 1100 is similar to the device 100 and therefore to avoid repetition only the differences will be described. Furthermore identical numerals in the figures indicate identical elements and as illustrated there are resilient dielectric pillars or spikes 1120 extending from at least one surface of each cavity 1110, typically the floor 1210, to support the laminated membrane 120. As above, each cavity 1110 can be any suitable shape such as cylindrical, conical or frusto-conical.

Figure 13:
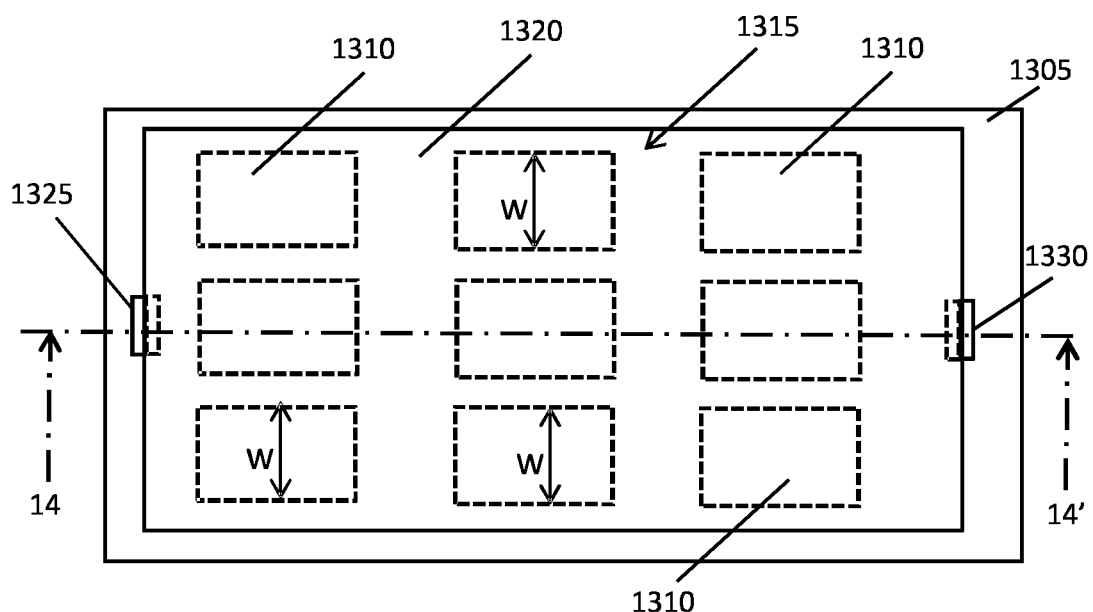
FIG. 13 is a plan view of a device according to a seventh embodiment of the present invention.
Figure 14:
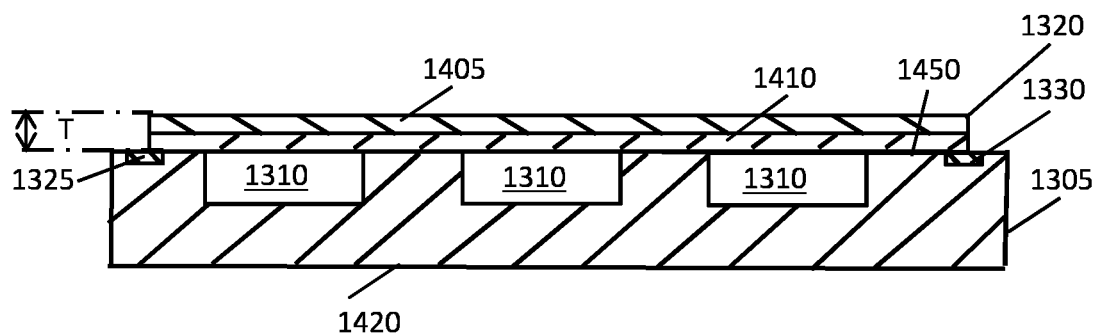
FIG. 14 is a cross sectional side view through 14-14' of the device of FIG. 13 according to the seventh embodiment of the present invention.

Referring now to FIG. 13 and FIG. 14 there is illustrated a device 1300 according to a seventh embodiment of the present invention. The device 1300 includes a substrate 1305 with at least one open topped cavity 1310 formed in the substrate 1305. In this particular embodiment, as illustrated, there is a plurality of cavities 1310 formed in an array 1315, and each of the cavities 1310 has a greatest width (w) between opposite internal surfaces which in this embodiment is a constant width throughout the depth of each cavity 1310.

The device 1300 also includes a laminated membrane 1320 mounted to the substrate 1305. In this embodiment the laminated membrane 1320 spans each cavity 1310 and completely covers each cavity 1310. Typically the laminated membrane 1320 forms an air tight seal for each cavity 1310.

In some embodiments a ratio of a surface area of the laminated membrane 1320 spanning each cavity 1310 is between 0.5 to twenty times that of a surface area of the laminated membrane 1320 abutting the substrate 1305. In other embodiments the ratio of a surface area of the laminated membrane 1320 spanning each cavity 1310 is between five to ten times that of a surface area of the laminated membrane 1320 abutting the substrate 1305. In this embodiment the device 1300 includes a first electrode in the form of a first metallic pad 1325 formed on or in the substrate 1305 and electrically attached to the laminated membrane 1320. There is also a second electrode in the form of a second metallic pad 1330 formed on or in the substrate 1305 and spaced from the first metallic pad 1325. The metallic pad 1325 and the second metallic pad 1330 provide surfaces for attachment of wire bonds as will be apparent to a person skilled in the art.

As illustrated, the laminated membrane 1320 includes layers of material which are at least one layer of a flexible material 1405 and at least one layer of a two-dimensional material 1410. In one embodiment the laminated membrane 1320 may comprise a single layer of two dimensional material 1410. The laminated membrane 1320 may also comprise a single layer of flexible material 1405.

In one embodiment the flexible material 1405 is a dielectric material typically comprising a polymer or a ceramic substance. A portion of the flexible material 1405 may abut the substrate 1305 and thus be sandwiched between the substrate 1305 and two-dimensional material 1410. However, in some embodiments the two-dimensional material 1410 may abut the substrate 1305 and thus be sandwiched between the substrate 1305 and flexible material 1405.

The layer of the two-dimensional material 1410 may be a continuous layer or may comprise discontinuous sections or discontinuous sections of different two-dimensional materials. In some embodiments the thickness (T) of the laminated membrane 1320 is less than the greatest width (w) of each cavity 1310 and may be at least 100 times less than a greatest width (w) of each cavity 1310. In other embodiments the thickness (T) of the laminated membrane 1320 is greater than or equal to a greatest width (w) of each cavity 1310.

Embodiments of the laminated membrane 1320 may comprise: at least two layers of the two-dimensional material 1410 sandwiching at least one layer of the flexible material 1405; or at least two layers of the flexible material 1405 sandwiching at least one layer of the two-dimensional material 1410; or one layer of the two-dimensional material 1410 deposited directly on top of one layer of the two-dimensional material 1410.

In this embodiment the substrate 1305 comprises a dielectric material selected from a group comprising: silicon oxide, silicon, silicon nitride, an epoxy based photoresist, an electron-beam resist, quartz, sapphire, glass, plastic, fibreglass, hafnium oxide, aluminium oxide, boron nitride and doped silicon. The first metallic pad 1325 second metallic pad 1330 are arranged to form terminals separated by the at least part of each cavity 1310. If required, each cavity 1310 may be filled with a gas or a compressible foam or gel.

Each cavity 1310 can be of many shapes and as shown each cavity 1310 in this embodiment is rectangular in shape and comprises a floor and at least two opposing parallel surfaces normal to the floor. However each cavity 1310 can be for instance conical or frusto-conical in shape and include an inwardly tapered surface.

The substrate 1305 typically comprises a planar mounting surface 1450 parallel to and supporting the laminated membrane 1320. In some embodiments there may be passages in the substrate 1305 for providing fluid communication from each cavity 1310 to an external surface 1420 of the substrate 1305. In some embodiments there may be resilient dielectric pillars or spikes extending from at least one surface of each cavity 1310 to support the laminated membrane 1320. In yet further embodiments there may be a frame on the laminated membrane 1320 that surrounds an opening of each cavity 1310 and may individually surround an opening of each cavity 1310. The frame acts as a clamp to stretch the laminated membrane 1320 and is typically formed of a polymer or ceramic material.

Figure 15:
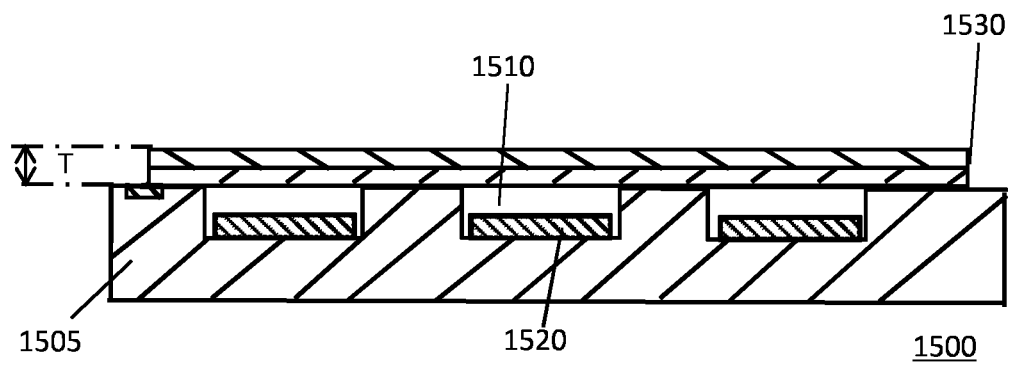
FIG. 15 is a cross sectional side view through 15-15' of the device according to an fifteenth embodiment of the present invention.

Referring now to FIG. 15 there is illustrated a device 1500 according to an embodiment of the present invention. The device 1500 includes a substrate 1505 with at least one open topped cavity 1510 formed in the substrate 1505. Each cavity may be of any suitable shape such cylindrical, conical or frusto-conical. The device 1500 is similar to the device 100 and therefore to avoid repetition only the differences will be described. The device 1500 may comprise a functional component, wherein in operation the laminated membrane 1530 is arranged to deform with respect to the position of the functional component. In this embodiment, the functional component comprises a second electrode 1520. The second electrode 1520 is formed from a conductive electrically attached to a second electrode region positioned within the cavity 1510. The conductive material may be deposited on at least one of the inside surfaces of the cavity.

In this embodiment, the laminated membrane 1530 and the second electrode region are arranged to form capacitive plates. Typically, the second electrode region comprises silicon or metal separated by at least part of the cavity. In operation, a deflection of the laminated membrane 1530 with respect to the second electrode 1520 induces a change in capacitance between the laminated membrane 1530 and the second electrode 1520. In other embodiments, by applying a bias between the laminated membrane 1530 and the second electrode 1520 a change in transconductance can be measured across the laminated membrane 1530 as a function of membrane deflection. In some embodiments, the device may function as an actuator, wherein a bias applied across the second electrode 1520 and the laminated membrane 1530 induces a deformation or deflection in the laminated membrane.

Figure 16:
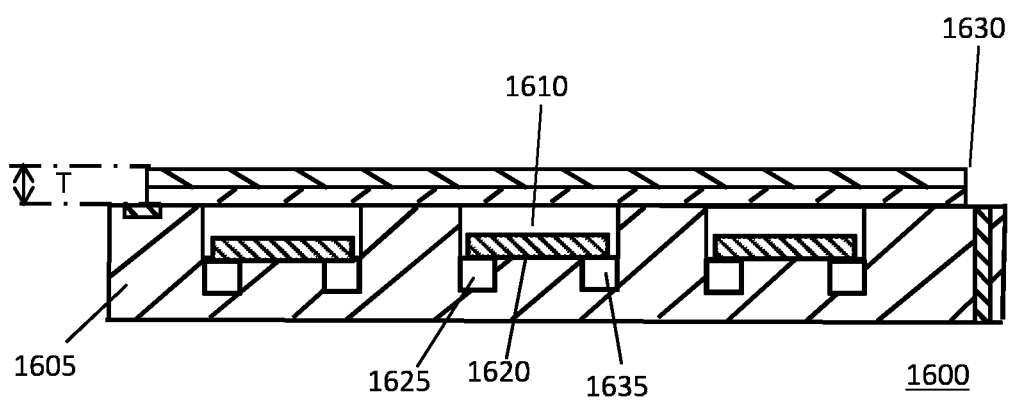
FIG. 16 is a cross sectional side view through 16-16' of the device according to a sixteenth embodiment of the present invention.

Referring now to FIG. 16 there is illustrated a device 1600 according to an embodiment of the present invention. The device 1600 includes a substrate 1605 with at least one open topped cavity 1610 formed in the substrate 1605. Each cavity 1610 may be of any suitable shape such cylindrical, conical or frusto-conical. The device 1600 is similar to the device 100 and therefore to avoid repetition only the differences will be described. The device 1600 may comprise a functional component, wherein in operation the laminated membrane 1630 is arranged to deform with respect to the position of the functional component. In this embodiment, the functional component comprises a semiconductor material 1620, such as silicon. In some embodiments, the semiconductor material may be deposited one at least one of the surfaces comprising the cavity 1610. In other embodiments, the semiconductor material 1620 may be positioned elsewhere on the substrate 1605. The semiconductor material may be coupled to at least two conductive contacts 1625, 1635 to form a transistor or diode arrangement, as will be appreciated by the skilled person. The contacts 1625, 1635 may be coupled to external circuitry. Although not shown in the figure, it will be appreciated that the device 1600 may comprise a second electrode.

In operation, a bias is applied to the laminated membrane 1630 and the semiconductor material 1620. A deflection in the laminated membrane 1630 with respect to the semiconductor material 1620 induces a change in the electric field in the vicinity of the semiconductor material 1630, resulting in a change in voltage across the semiconductor material 1630 across the at least two contacts 1625, 1635.

Figure 17:
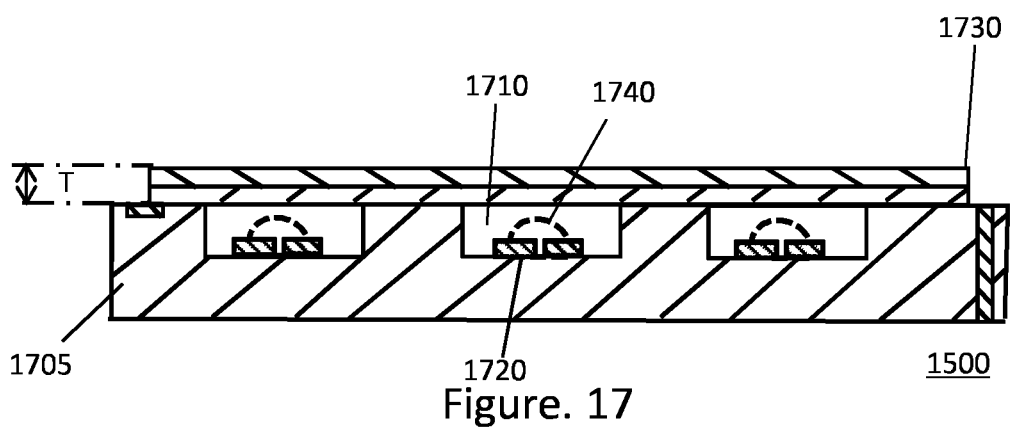
FIG. 17 is a cross sectional side view through 17-17' of the device according to a seventeenth embodiment of the present invention.

Referring now to FIG. 17, there is illustrated a device 1700 according to an embodiment of the present invention. The device 1700 includes a substrate 1705 with at least one open topped cavity 1710 formed in the substrate. Each cavity 1710 may be of any suitable shape such cylindrical, conical or frusto-conical. The device 1700 is similar to the device 100 and therefore to avoid repetition only the differences will be described. The device 1700 may comprise a functional component, wherein in operation the laminated membrane 1730 is arranged to deform with respect to the position of the functional component. In this embodiment, the functional component comprises a dielectric or semiconducting material 1720 positioned within the cavity. The dielectric or semiconducting material may be in the form of a wave-guide 1720. The wave-guide 1720 may be coupled to an external optical coupling device. Although not shown in the figure, it will be appreciated that the device 1700 may comprise a second electrode as in previous embodiments.

In operation, optical radiation is coupled in and out of the wave-guide 1720. The vicinity of the wave-guide 1720 is surrounded by an evanescent electromagnetic field 1740. A deflection of the laminated membrane 1730 with respect to the wave-guide 1720 attenuates the intensity of the optical radiation or shifts the wavelength of the optical radiation through the wave-guide 1720. As will be apparent to the skilled reader, the change in signal may then be detected by a photodetector or spectrum analyser.

Figure 18:
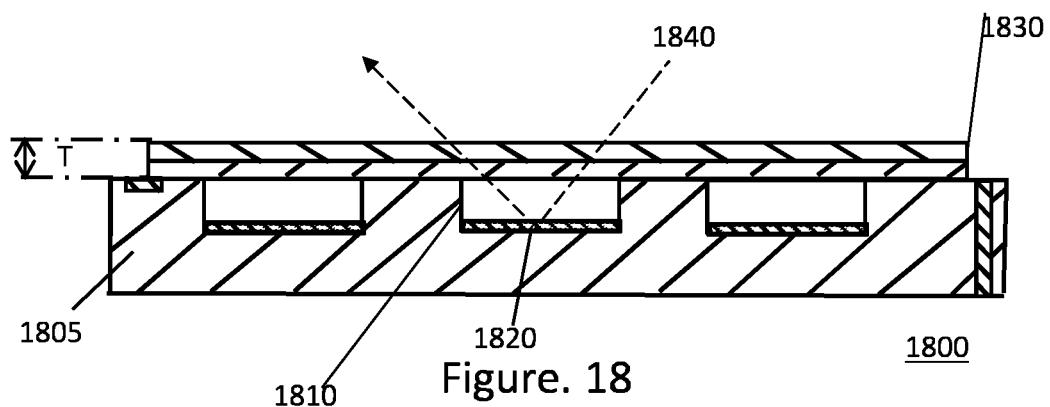
FIG. 18 is a cross sectional side view through 18-18' of the device according to a eighteenth embodiment of the present invention.

Referring now to FIG. 18, there is illustrated a device 1800 according to an embodiment of the present invention. The device includes a substrate 1805 with at least one open topped cavity 1810 formed in the substrate. Each cavity 1810 may be of any suitable shape such cylindrical, conical or frusto-conical. The device 1800 is similar to the device 100 and therefore to avoid repetition only the differences will be described. The device 1800 may comprise a functional component, wherein in operation the laminated membrane 1830 is arranged to deform with respect to the position of the functional component. In this embodiment, the functional component comprises a reflective surface 1820 positioned within the cavity 1810, forming an optical mirror surface 1820. The reflective surface 1820 may be deposited on at least one surface of the cavity 1810. The reflective surface 1820 may comprise gold, or any other similarly reflective material.

In operation, optical radiation 1840 is projected into the cavity 1810. A deflection of the laminated membrane 1830 with respect to the reflective surface 1820 induces a change in the path and/or direction of the optical radiation 1840. The resulting change in the path or direction of the optical radiation 1840 may then be detected by a detector. Although not shown in the figure, it will be appreciated that the device 1800 may comprise a second electrode as in previous embodiments.

Figure 19:
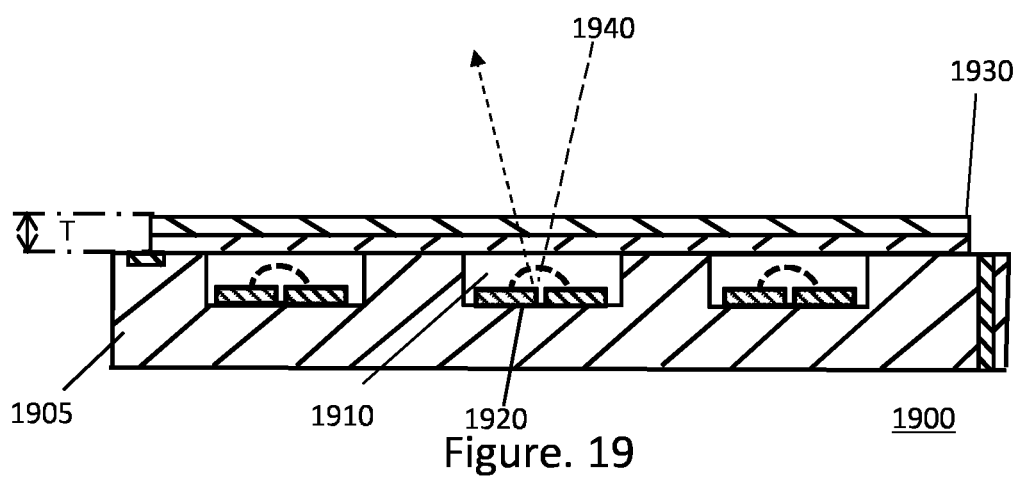
FIG. 19 is a cross sectional side view through 19-19' of the device according to a nineteenth embodiment of the present invention.

Referring now to FIG. 19, there is illustrated a device 1900 according to an embodiment of the present invention. The device includes a substrate 1905 with at least one open topped cavity 1910 formed in the substrate 1905. Each cavity 1910 may be of any suitable shape such cylindrical, conical or frusto-conical. The device 1900 is similar to the device 100 and therefore to avoid repetition only the differences will be described. The device 1900 may comprise a functional component, wherein in operation the laminated membrane 1930 is arranged to deform with respect to the position of the functional component. In this embodiment, the functional component comprises a plasmonic structure 1920 positioned within the cavity 1910, forming an optical or infrared antenna 1920. The plasmonic structure 1920 may comprise a nanoscale pattern of a metal such as gold or silver, or a semiconductor. Although not shown in the figure, it will be appreciated that the device 1900 may comprise a second electrode as in previous embodiments.

In operation, optical radiation 1940 is focused on the plasmonic structure 1920. The optical radiation 1940 triggers a plasmonic resonance oscillation of electrons in the antenna 1920 resulting in localised electromagnetic fields 1940 in the vicinity of the plasmonic structure 1920. A deflection of the laminated membrane 1930 with respect to the plasmonic structure 1920 causes a shift in the emitted radiation. For example, the intensity of the Raman spectrum of the 2-d material can be modulated by the relative proximity of the laminated membrane 1930 to plasmonic structure 1920.

Figure 20:
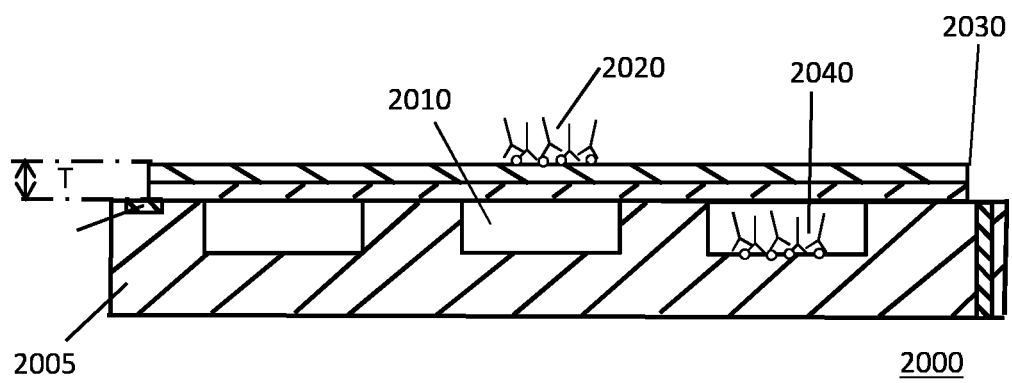
FIG. 20 is a cross sectional side view through 20-20' of the device according to a twentieth embodiment of the present invention.

Referring now to FIG. 20, there is illustrated a device 2000 according to an embodiment of the present invention. The device includes a substrate 2005 with at least one open topped cavity 2010 formed in the substrate 2005. Each cavity 2010 may be of any suitable shape such cylindrical, conical or frusto-conical. The device 2000 is similar to the device 100 and therefore to avoid repetition only the differences will be described. Furthermore identical numerals in the figures indicate identical elements. The device 2000 may comprise a functional component, wherein in operation the laminated membrane 2030 is arranged to deform with respect to the position of the functional component. In this embodiment, the functional component comprises a chemically active surface 2020, 2040. The chemically active surface may be deposited either within the cavity 2040, or on the laminated membrane 2020. Although not shown in the figure, it will be appreciated that the device 2000 may comprise a second electrode as in previous embodiments. In operation, the device 2000 is placed in an environment containing gaseous chemicals. Chemical species that are complimentary to the chemically active surface 2020, 2040 may adsorb onto the chemical receptors of the chemically active surface 2020, 2040. The adsorbates carry charge and therefore induce a change in the capacitance or transconductance across the laminated membrane 2030.

Figure 21:
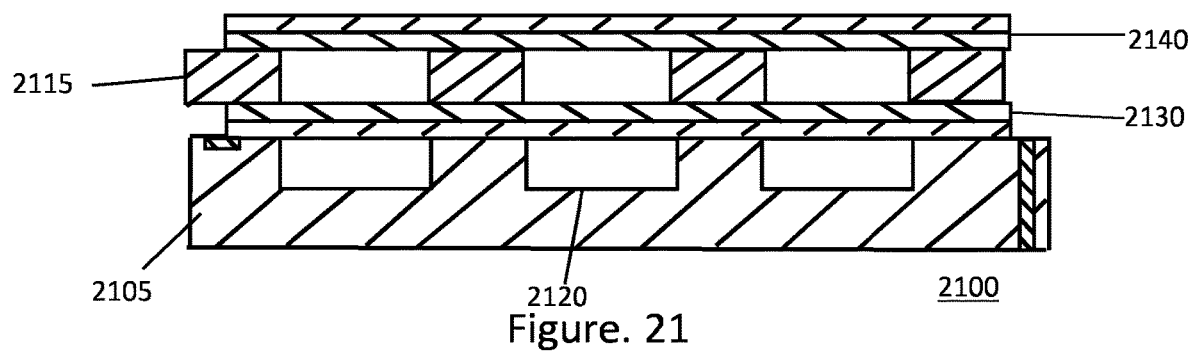
FIG. 21 is a cross sectional side view through 21-21' of the device according to a twenty-first embodiment of the present invention.

Referring now to FIG. 21, there is illustrated a device 2100 according to an embodiment of the present invention. The device 2100 includes a substrate 2105 with at least one open topped cavity 2120 formed in the substrate. The device 2100 is similar to the device 100 and therefore to avoid repetition only the differences will be described.

In this embodiment, a second substrate layer 2115 is positioned on top of the first laminated membrane 2130. The second substrate layer 2115 may form a spacer pattern. A second laminated membrane 2140 may be positioned on top of the second substrate layer 2115. Although not shown in the figure, it will be appreciated that the device 2100 may comprise a second electrode as in previous embodiments.

In operation, a deflection in either the first or second laminated membrane 2130, 2140 induces a change in capacitance between the first laminated membrane 2130 and the first electrode. In some embodiments, by applying a bias either between the first and second laminated membranes 2130, 2140 or to either one of the first and second laminated membranes separately, a change in transconductance can be measured across the first laminated membrane 2130 as a function of membrane deflection.

Figure 22:
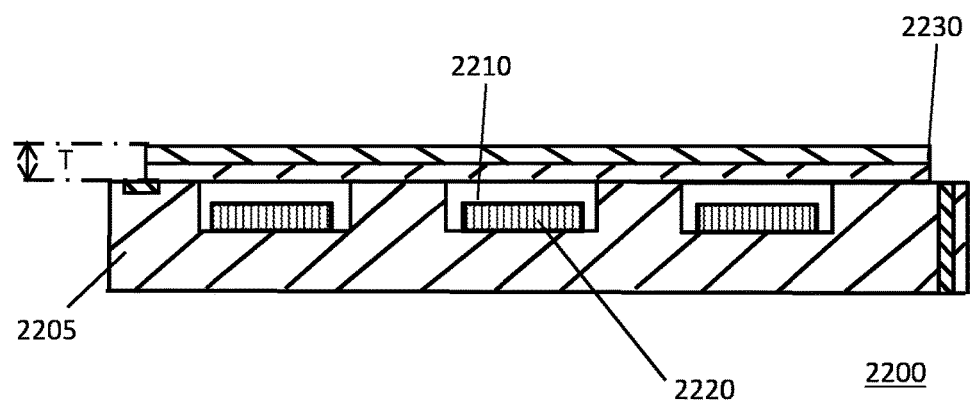
FIG. 22 is a cross sectional side view through 22-22' of the device according to a twenty-second embodiment of the present invention.

Referring now to FIG. 22, there is illustrated a device 2200 according to an embodiment of the present invention. The device 2200 includes a substrate 2205 with at least one open topped cavity 2210 formed in the substrate 2205. The device 2200 is similar to the device 100 and therefore to avoid repetition only the differences will be described. The device 2200 may comprise a functional component, wherein in operation the laminated membrane 2230 is arranged to deform with respect to the position of the functional component. In this embodiment, the functional component comprises vertically aligned nanostructures (VANs) 2220 positioned within the cavity 2210. The vertically aligned nanostructures may comprise carbon nanotubes (CNTs), nanowires, quantum dots, nanoparticles, nano-platelets, or any other suitable nanomaterial. The vertically aligned nanostructures 2220 may be coupled to external circuitry. Although not shown in the figure, it will be appreciated that the device 2200 may comprise a second electrode as in previous embodiments.

In operation, by applying a bias to the vertically aligned nanostructures 2220, an electric field can be generated at the vertically aligned nanostructures 2220. A deflection in the laminated membrane 2230 with respect to the vertically aligned nanostructures 2220 induces a change in the electrical conductivity of the first electrode 2240. In some embodiments, a deflection in the laminated membrane 2230 with respect to the vertically aligned nanostructures induces a change in the capacitance between the laminated membrane 2230 and the vertically aligned nanostructures 2220. In some embodiments, a deformation in the laminated membrane 2230 with respect to the vertically aligned nanostructures induces a change in the transconductance of the laminated membrane 2230.

Figure 23:
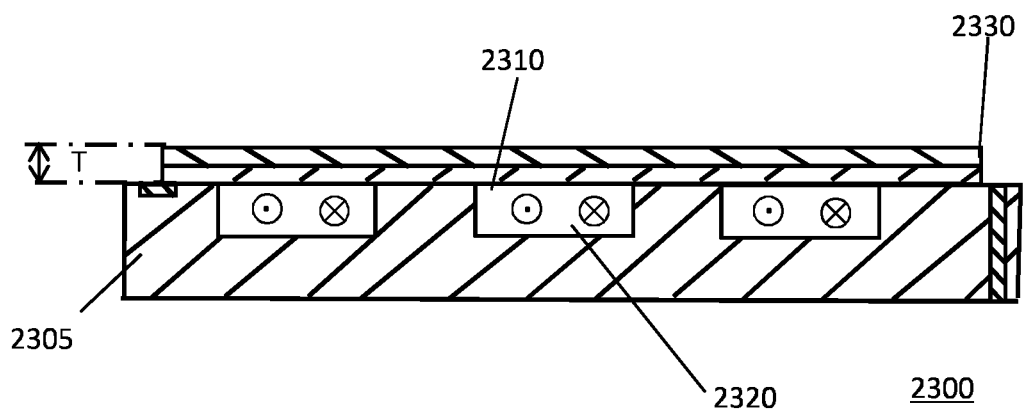
FIG. 23 is a cross sectional side view through 23-23' of the device according to a twenty-third embodiment of the present invention.

Referring now to FIG. 23, there is illustrated a device 2300 according to an embodiment of the present invention. The device 2300 includes a substrate with at least one open topped cavity 2310 formed in the substrate 2305. The device 2300 is similar to the device 100 and therefore to avoid repetition only the differences will be described. The device 2300 may comprise a functional component, wherein in operation the laminated membrane 2330 is arranged to deform with respect to the position of the functional component. In this embodiment, the functional component comprises a magnetic material 2320 positioned within the cavity 2310. The magnetic material 2320 may be coupled to external circuitry. Although not shown in the figure, it will be appreciated that the device 2300 may comprise a second electrode as in previous embodiments.

In operation, a magnetic field is produced by the magnetic material 2320. A deflection of the laminated membrane 2330 with respect to the magnetic material 2320 induces a change in the magnetic field, which may then be detected by a magnetic sensing means.

Figure 24:
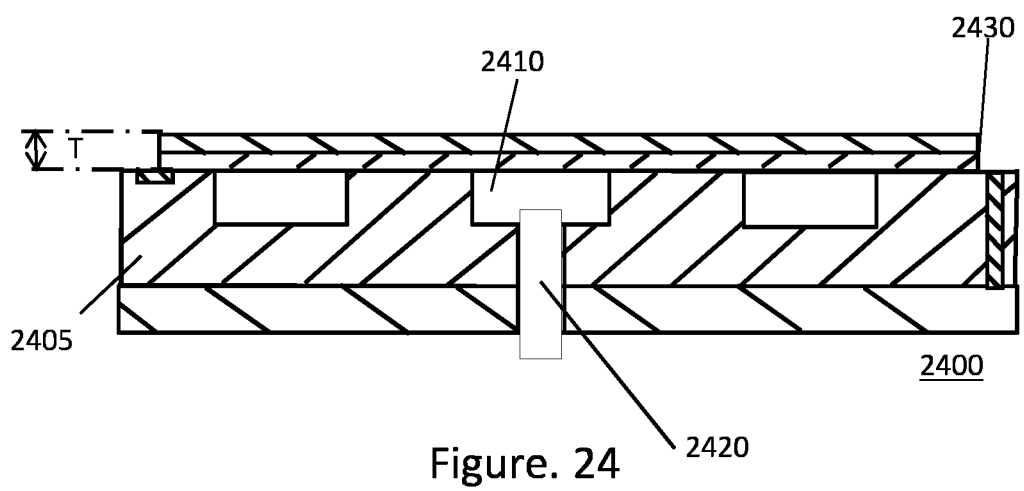
FIG. 24 is a cross sectional side view through 24-24' of the device according to a twenty-fourth embodiment of the present invention.
Figure 25:
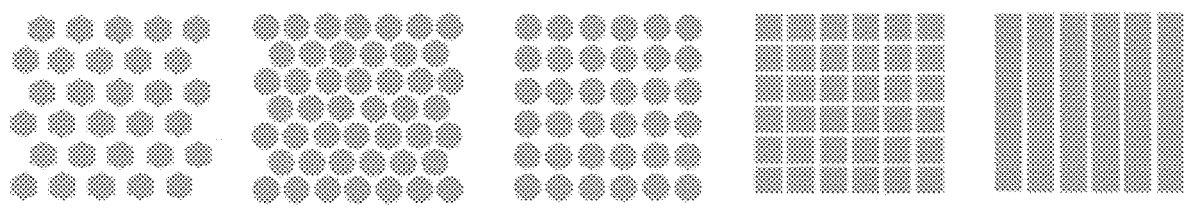
FIG. 25 is a plan view of a device according to another embodiment of the present invention.

Referring now to FIG. 24, there is illustrated a device 2400 according to an embodiment of the present invention. The device 2400 includes a substrate 2405 with at least one cavity 2410 formed in the substrate 2405. The device 2400 is similar to the device 100 and therefore to avoid repetition only the differences will be described. In this embodiment, the cavity includes a second aperture 2420. The aperture 2420 may be a vent-hole through which a pressure may be applied onto the corresponding side of laminated membrane 2430. Although not shown in the figure, it will be appreciated that the device 2400 may comprise a second electrode as in previous embodiments.

In operation, the deflection of the laminated membrane may be a function of pressures applied directly onto the membrane 2430 and/or through the aperture 2420.

In another embodiment of the invention, the device may comprise any combination of functional components as described above.

Embodiments of the device (100, 300, 500, 700, 900, 1100, 1300, 1500, 1600, 1700, 1800, 1900, 2000, 2100, 2200, 2300, 2400) described in the above FIGS. 1 to 24 may include a surface of each cavity coated with a substance having anti-stick properties relative to the two-dimensional material. As an alternative a surface of each cavity can be roughened to provide anti-stick properties relative to the two-dimensional material. Also, in some embodiments each or some of the cavities can be for instance the same shape or different in shape.

Figure 26:
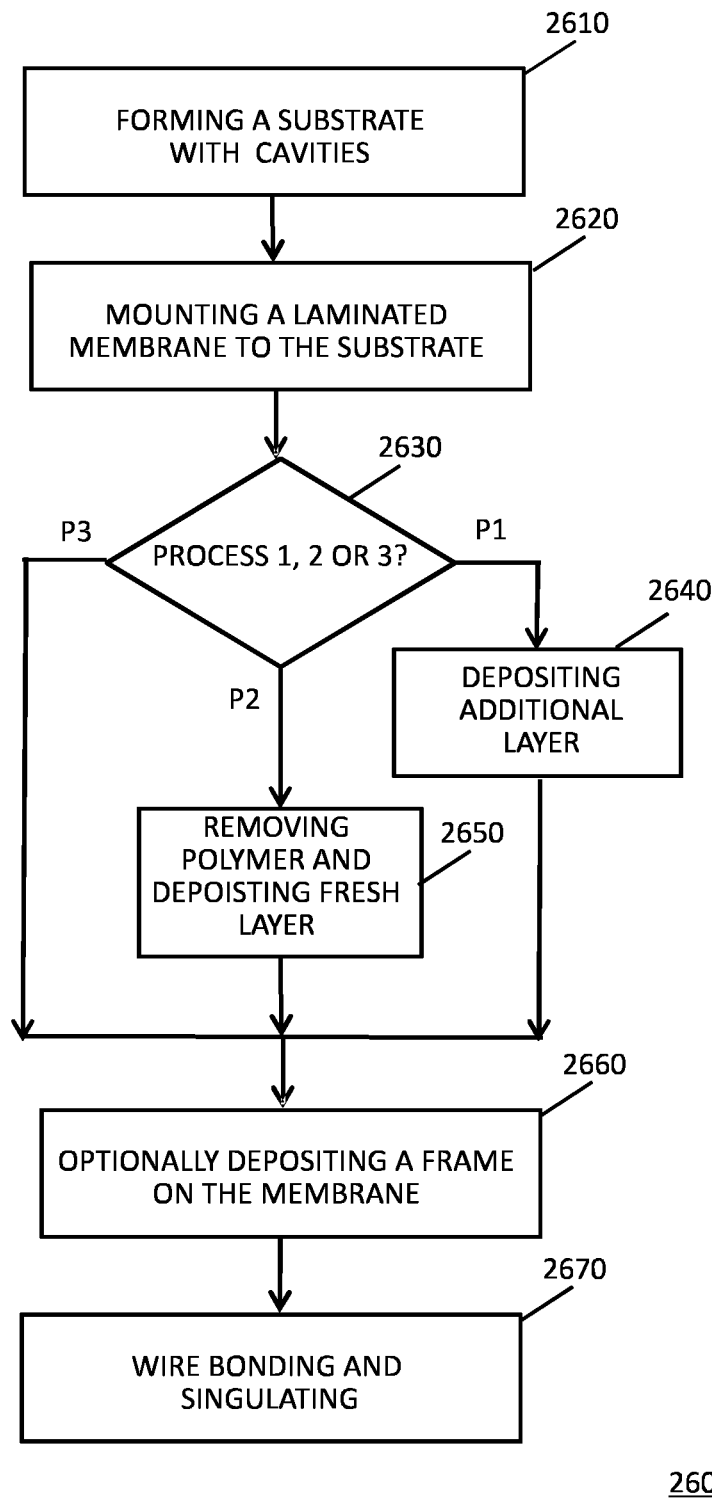
FIG. 26 is a flow chart illustrating a method of fabricating a device according to another embodiment of the present invention.

Embodiments of the device described in the above FIGS. 1 to 24 may comprise cavities forming any of hexagonal, square, rectangular, or circular shape arrangements as shown in FIG. 24. The cavities may also be of triangular or ring shape arrangements. Referring now to FIG. 26 there is shown a flow chart illustrating a method 2600 of fabricating a device according to another embodiment of the present invention. By way of example only, the method 2600 will be described with reference to the fabrication of the device 100 but it is to be understood that the method is not limited to the specific fabrication of only the device 100.

The method 2600, at a forming block 2610, provides for forming the substrate 105 with one or more cavities 110 formed in the substrate 105. Each cavity 110 is typically formed by plasma etching or laser engraving as will be understood by a person skilled in the art. At a mounting block 2620 the laminated membrane 120, comprising the at least one layer of a flexible material 205 and at least one layer of a two-dimensional material 210, is mounted to the substrate 105. The process of mounting is performed so that so the laminated membrane 120 spans at least part of each cavity 110. In some embodiments the inherent adhesive properties of the two dimensional material 210 or flexible material 205 (depending on which one thereof abuts the substrate 105) is sufficient for the fixing of the laminated membrane 120 to the substrate 105. However, in another embodiment a flexible dielectric adhesive layer may be used to fix the laminated membrane 120 to the substrate 105 and may comprise applying the adhesive layer to the planar mounting surface 250.

In some embodiments the mounting of the laminated membrane 120 to the substrate 105 is performed so that the laminated membrane 120 completely covers each cavity 110 and may form an air tight seal for the cavity 110.

The laminated membrane 120 may comprise at least two layers of the two-dimensional material 210 sandwiching at least one layer of the flexible material 205 or the laminated membrane 120 may comprise at least two layers of the flexible material 205 sandwiching at least one layer of the two-dimensional material 210.

At a decision block 2630 one of three processes P1, P2 or P3 may be selected. If process P1 is selected then a block 2640 provides for depositing an additional layer of the flexible material 205 such as a polymer onto the laminated membrane 120. If process P2 is selected then a block 2650 provides for removing the flexible material 205, such as a polymer, to expose the two-dimensional material 210. Thereafter the method 2600 provides for depositing a fresh layer of the flexible material 205, typically a polymer, onto the two-dimensional material 210. After completion of either process P1 or P2, or if P3 is selected, the method 2600 at a block 2660 optionally performs depositing a polymer frame on the laminated membrane 120, wherein the polymer frame surrounds an opening of each cavity 110. Then the method 2600 performs at a block 2670 singulating, by cutting or sawing, the substrate 105 from a sheet of substrates thereby dividing the sheet into individual substrates. Wire bonds are also welded to the metallic pad 125 and the conductive via 130.

Advantageously the flexible material and two-dimensional material provides for improved structural integrity of the membrane and also allows for control of a desired tensioning of the membrane. Also, the inwardly tapered surfaces of the conical, frusto-conical or other suitably shaped cavities that are proximal to the membrane attract the proximal regions of the membrane. Such attracted regions affix the upper regions of the cavity surface which therefore increases the tensioning of the membrane. In addition, or as an alternative, the frame may also be used to tension the membrane.

In some embodiments the flexible material may also provide a proactive covering for the two-dimensional material. Consequently, the present invention at least alleviates one of the problems associated with the prior art. Also, the device may be used as a sensor, a transducer such as a piezoelectric device, or any other device that provides a signal in response to a deflection in the membrane or deflects the membrane in response to a signal applied across the electrodes or from any other response to an external force.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. A device comprising:
    a substrate with at least one cavity therein;
    a flexible laminated membrane mounted to the substrate, wherein the flexible laminated membrane spans at least part of the cavity, and wherein the flexible laminated membrane includes at least one layer of a flexible dielectric material and at least one layer of a two-dimensional material, wherein the substrate comprises a planar mounting surface supporting the flexible laminated membrane and the cavity comprises at least one inwardly tapered surface; and
    a functional component, wherein the flexible laminated membrane is arranged to deform with respect to a position of the functional component.

2. The device of claim 1, wherein the functional component comprises one of an electrode, a semiconductor, a dielectric, a wave-guide, a reflective surface, a plasmonic structure, a chemically active surface, a second flexible laminated membrane, a nanostructure, a magnetic material, or an aperture.

3. The device of claim 1, wherein the layer of the two-dimensional material is a continuous layer.

4. The device of claim 1, wherein the layer of the two-dimensional material comprises discontinuous sections of the two-dimensional material or discontinuous sections of different two-dimensional materials.

5. The device of claim 1, wherein the flexible laminated membrane completely covers the cavity.

6. The device of claim 5, wherein the flexible laminated membrane forms an air tight seal for the cavity.

7. The device of claim 1, wherein the thickness of the flexible laminated membrane is less than a greatest width of the cavity.

8. The device of claim 1, wherein the thickness of the flexible laminated membrane is greater than or equal to a greatest width of the cavity.

9. The device of claim 1, wherein the flexible laminated membrane comprises at least two layers of the two-dimensional material sandwiching at least one layer of the flexible material.

10. The device of claim 1, wherein the flexible laminated membrane comprises at least two layers of the flexible material sandwiching at least one layer of the two-dimensional material.

11. The device of claim 1, wherein the flexible laminated membrane comprises one layer of the two-dimensional material deposited directly on top of another layer of the two-dimensional material.

12. The device of claim 1, including a frame arranged upon the flexible laminated membrane to provide a tensioning thereof.

13. The device of claim 1, including resilient dielectric pillars or spikes extending from at least one surface of the cavity to support the flexible laminated membrane.

14. The device of claim 1, wherein the cavity comprises a floor and at least two opposing parallel surfaces normal to the floor.

15. The device of claim 1, wherein a surface of the cavity is coated with a substance having anti-stick properties relative to the two-dimensional material.

16. The device of claim 1, wherein a surface of the cavity is roughened to provide anti-stick properties relative to the two-dimensional material.

17. The device of claim 1, wherein the two-dimensional material is selected from a group of materials including: one or more single layers of homo-atoms or hetero-atoms arranged in layers with strong bonds within a layer and weaker bonds in between layers of the material; or a single layer of homo-atoms or hetero-atoms that is either freestanding or supported on another material wherein the atoms are arranged in a planar structure which has one dimension significantly smaller than its other two dimensions; or a crystalline material wherein unit cells are repeated in two spatial dimensions but not in the third dimension; or a material having a thickness of less than five nanometres.

18. The device of claim 1, wherein the two-dimensional material includes chemical modifications of materials selected from a group comprising: graphene, hexagonal boron nitride, phosphorene, transition metal dichalcogenides, transition metal oxides, layered clay materials, graphene oxide, fluorographene, germanene, graphane, graphyne, borophene, silicene, and stanene.

19. The device of claim 1, wherein the flexible dielectric material comprises a polymer or ceramic substance.

20. A method of fabricating a device, the method comprising:

forming a substrate having a planar mounting surface, the substrate with at least one cavity having at least one inwardly tapered surface therein, and mounting a flexible laminated membrane to the planar mounting surface of the substrate so that the flexible laminated membrane spans at least part of the cavity, and wherein the flexible laminated membrane includes at least one layer of a flexible dielectric material and at least one layer of a two-dimensional material; and mounting a functional component to the substrate, wherein the flexible laminated membrane is arranged to deform with respect to a position of the functional component.

21. The method of claim 20, wherein the mounting of the functional component to the substrate comprises mounting one of an electrode, a semiconductor, a wave-guide, a reflective surface, a plasmonic structure, a chemically active surface, a second flexible laminated membrane, a nanostructure, a magnetic material, or an aperture to the substrate.

22. The method of claim 20, wherein the mounting of the flexible laminated membrane comprises mounting at least two layers of the two-dimensional material sandwiching at least one layer of the flexible dielectric material to the substrate.

23. The method of claim 20, wherein the mounting of the flexible laminated membrane comprises mounting at least two layers of the flexible dielectric material sandwiching at least one layer of the two-dimensional material to the substrate.

24. The method of claim 20 including depositing a polymer frame on the flexible laminated membrane, wherein the polymer frame surrounds an opening of the cavity.

25. The method of claim 20, wherein the flexible material comprises a polymer, and wherein after the mounting the method comprises depositing an additional layer of polymer onto the flexible laminated membrane.

26. The method of claim 20, wherein the flexible dielectric material comprises a polymer, and wherein after the mounting the method comprises removing the polymer to expose the two-dimensional material and thereafter depositing a fresh layer of polymer onto the two-dimensional material.

27. The method of claim 20, wherein the two-dimensional material is selected from a group of materials including: one or more single layers of homo-atoms or hetero-atoms arranged in layers with strong bonds within a layer and weaker bonds in between layers of the material; or a single layer of homo-atoms or hetero-atoms that is either freestanding or supported on another material wherein the atoms are arranged in a planar structure which has one dimension significantly smaller than its other two dimensions; or a crystalline material wherein unit cells are repeated in two spatial dimensions but not in the third dimension; or a material having a thickness of less than five nanometres.

28. The method of claim 20, wherein the two-dimensional material includes chemical modifications of materials selected from a group comprising: graphene, hexagonal boron nitride, phosphorene, transition metal dichalcogenides, transition metal oxides, layered clay materials, graphene oxide, fluorographene, germanene, graphane, graphyne, borophene, silicene, and stanene.

* * * * *